United States Patent [19]

Zendle et al.

[11] 4,362,898

[45] Dec. 7, 1982

[54] FLUSH MOUNTED LOW IMPEDANCE GROUNDING CONE

[75] Inventors: Bernard Zendle, Adelphi; Marcella Petree, Silver Spring, both of Md.

[73] Assignee: The United States of America as represented by the Secretary of the Navy, Washington, D.C.

[21] Appl. No.: 214,545

[22] Filed: Dec. 9, 1980

[51] Int. Cl.³ .............................................. H05K 9/00
[52] U.S. Cl. .................................. 174/35 R; 333/12
[58] Field of Search ................... 174/6, 35 R, 35 MS, 174/35 C, 78; 339/143 R; 333/12; 248/56

[56] References Cited

U.S. PATENT DOCUMENTS

| | | | |
|---|---|---|---|
| 713,537 | 11/1902 | Treadwell | 248/56 X |
| 2,410,999 | 11/1946 | Reisner | 285/30 |
| 2,490,596 | 12/1949 | Morris | 174/35 C |
| 4,090,029 | 5/1978 | Lundeberg | 174/51 |

OTHER PUBLICATIONS

MIL-STD-1310C(Navy), Nov. 30, 1973, p. 29.

MIL-STD-1310D(Navy), Feb. 8, 1979, p. 32.

*Primary Examiner*—A. T. Grimley
*Assistant Examiner*—D. A. Tone
*Attorney, Agent, or Firm*—R. S. Sciascia; A. L. Branning; Wynn J. G.

[57] ABSTRACT

A device for grounding a coaxial cable to a ship's hull or bulkhead having an opening for the cable, is configured to include a split metallic cone with serrated apex portions fastenable around a bared shield of the coaxial cable, and flanged base portions securable to the ship's hull and overlying the opening, such that the split cone forms substantially 360° of coupling between the bared shield and the ship's hull. This configuration increases the area and effectiveness of electrical contact between the bared shield and the ship's hull while decreasing the effective inductance and overall impedance, thereby reducing the amplitude of high frequency transients caused by an externally induced electromagnetic pulse (EMP) or any electromagnetic interference source having a similar frequency range.

4 Claims, 3 Drawing Figures

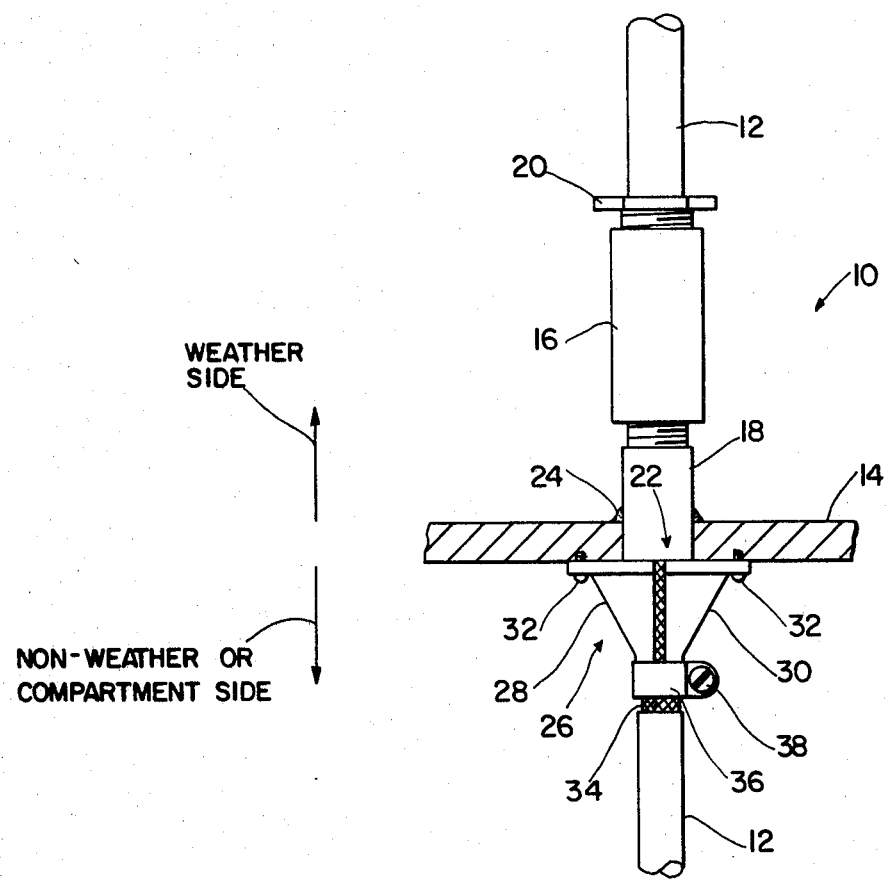
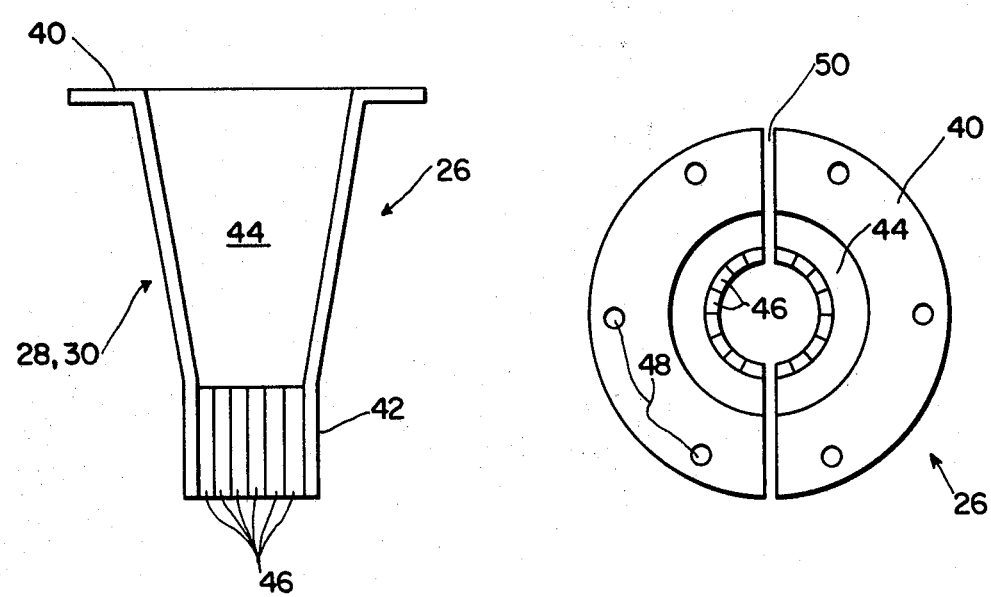
FIG. 2
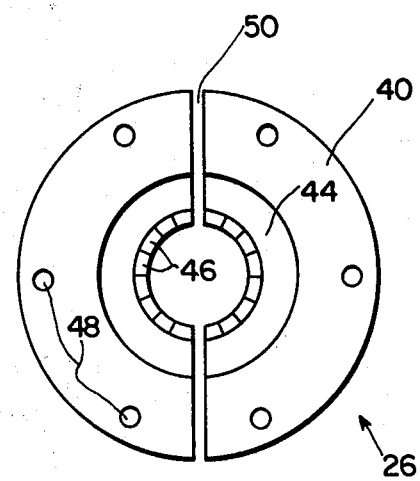
FIG. 3

FLUSH MOUNTED LOW IMPEDANCE GROUNDING CONE

BACKGROUND OF THE INVENTION

1. Field of the Invention

The present invention relates generally to grounding devices and more particularly to an improved low impedance grounding cone for the peripheral grounding of a coaxial cable to protect electronic functions aboard Naval ships in the presence of an electromagnetic pulse or any electromagnetic interference source having a similar frequency range.

2. Description of the Prior Art

An electromagnetic pulse, hereinafter (EMP), is an electrical signal of large amplitude and broad frequency range (0.1 MHz to 10 MHz) that is generated by a nuclear weapon at the time of detonation. An EMP may be present when all other nuclear weapon effects are absent and may upset or damage electronic equipment over a wide geographic area. The discussion hereintofollow applies to any electromagnetic interference source within the above frequency range.

The cable shield grounding technique for EMP protection presently used on most operational fleet ships is described in MIL-STD-1310C (Navy), Nov. 30, 1973, page 29. The technique essentially involves placing a metal hose clamp around the bared shield of a coaxial cable with an attached grounding strap having one end welded to the clamp and the other end welded to the hull or bulkhead of the ship. These grounding straps are from 6 to 12 inches long and, thus, exhibit a high inductance (high impedance) path to ground for the high frequency components present in externally induced currents in the shield from an EMP source. Consequently, there is a need in the prior art to improve attenuation of all frequency components of externally induced currents in the shield from an EMP source and especially the high frequency components.

Another cable shield grounding technique has been specified for use on operational fleet ships and is described in the most recent MIL-STD-1310D (Navy), Feb. 8, 1979, page 32. This technique includes installing a kickpipe through the ship's hull or bulkhead into a compartment. A grounding ring or sleeve is disposed over the bared shield of the coaxial cable when it is pulled through the kickpipe into the compartment. Then a lower nut is tightened about the grounding ring, bared shield of the coaxial and a threaded end of the kickpipe. This technique is an improvement over the grounding system, aforementioned, since it allows 360° grounding and decreases high frequency components of externally induced EMPs. Nevertheless, it does not provide for simple retrofitting of existing grounding systems, especially those with kickpipes mounted flush with the non-weather or compartment side of the ship's hull. Consequently, there is a need in the prior art to attenuate high frequency components of externally induced EMPs to levels heretofore unattainable, while simplifying retrofitting of the foregoing types of grounding systems on operational fleet ships.

OBJECTS OF THE INVENTION

Accordingly, a principal object of the present invention is to increase the area and effectiveness of electrical contact between a bared shield of a coaxial cable and a ship's hull while decreasing the effective inductance and overall impedance therebetween.

Another object of the present invention is to attenuate, in the shield of a coaxial cable, all frequency components of externally induced currents from an EMP or any electromagnetic source having a similar frequency range in an improved manner.

Yet another object of the present invention is to attenuate, in the shield of a coaxial cable, high frequency components of externally induced currents from an EMP or any electromagnetic source having a similar frequency range to a level heretofore unattainable.

A further object of the present invention is to configure a grounding device that simplifies retrofitting of a class of grounding systems presently on a substantial number of operational fleet ships.

Yet a further object of the present invention is to form a subtantially 360° electrical ground connection between a ship's hull and a bared shield of a coaxial cable in an improved manner.

A still further object of the present invention is to eliminate the need, in some cases, for a clamp to clamp the apexes of split cone halves of the low impedance grounding cone to a bared shield of a coaxial cable.

SUMMARY OF THE INVENTION

In accordance with these, other objects, advantages and features, the present invention has its primary purpose the improvement of grounding techniques for coaxial cable by simplifying retrofitting of existing grounding systems on operational fleet ships. The nature of the improvement is in the attenuation, in the shield of a coaxial cable, of high frequency components of externally induced currents from an EMP or any electromagnetic source having a similar frequency range to a level heretofore unattainable. The grounding device is configured to increase the area and effectiveness of electrical contact between a bared shield of the coaxial cable and a ship's hull while decreasing the effective inductance and overall impedance therebetween.

The foregoing is accomplished by splitting or forming a hollow metallic cone into two halves lengthwise. Each half of a flanged base or top portion of the cone is flush mounted and fastened to the non-weather or compartment side of the ship's hull or bulkhead by metallic screws. Each half of a serrated apex or bottom portion of the cone is secured to the bared shield of the coaxial cable by the spring pressure fingers action of the serrations. Additionally clamping both halves of the serrated apex portions of the cone around the bared cable shield by a cable clamp is the preferred technique. This forms an essentially continuous 360° electrical connection between the ship's hull and the bared shield of the coaxial cable.

The slant height of the cone, embodied in a body portion integral with the aforementioned flanged and serrated apex portions, it is configured, for a particular dimensioned cable, short enough to present a low inductance and overall low impedance path for the currents induced by the EMP in the exterior length of the cable. Hence, these currents are prevented from entering the interior electronic compartments and interfering with the proper functioning of the electronic systems therein.

BRIEF DESCRIPTION OF THE DRAWINGS

The foregoing, other objects, advantages and features of the present invention will be apparent from the more particular description of the preferred embodiment as illustrated in the accompanying drawings, in which:

FIG. 1 is a side elevational view of a bared shield of a coaxial cable connected to a ship's hull by a flush mounted low impedance grounding cone in accordance with the present invention;

FIG. 2 is a side elevational view of one-half of the low impedance grounding cone of FIG. 1 depicting its operational slant height, embodied in a body portion integral with a flanged base portion and a serrated apex portion, and illustrating the operational spring pressure fingers (serrations), formed into the inside surface of a serrated apex portion; and FIG. 3 is a plan view of both halves of the low impedance grounding cone of FIG. 1 showing, inter alia, the placement of the mounting holes on the flanged base portions in accordance with the present invention.

DESCRIPTION OF THE PREFERRED EMBODIMENT

An improved grounding system 10 that incorporates the present invention is shown in FIG. 1. A coaxial cable 12 extends from the weather side of a ship's hull or bulkhead 14 via a stuffing tube 16 threadedly attached to a kickpipe 18. Weather proofing rope (not shown) is stuffed into stuffing tube 16 and compressed therein by gland nut 20 to form a weather tight seal. Kickpipe 18 is fastened to bulkhead 14, via bulkhead opening 22, by surround weld 24.

Still referring to FIG. 1, a low impedance grounding cone 26, having mirrored first and second halves 28 and 30, is flush mounted at a top portion to bulkhead 14 by a plurality of fasteners 32. At a bottom portion, it is clamped around bared shield 34 by cable clamp 36 secured by fastener 38.

Referring now to FIG. 2, mirrored halves 28 and 30 of low impedance grounding cone 26 each include a flanged base 40 (the "top portion" aforementioned) and a serrated apex 42 (the "bottom portion" aforementioned). Integral with each of the flanged bases 40 and serrated apexes 42 is a hollow and slant body portion 44. As depicted, a plurality of spring pressure fingers or serrations 46 are formed into each serrated apex 42 on the inside surface thereof.

FIG. 3 is a plan view of the low impedance grounding cone 26 according to the invention. As shown, each flanged base 40 includes a plurality of mounting holes 48 disposed symmetrically therein. Also, mirrored first and second halves 28 and 30 are configured, when mirrored together, to have a split slot 50.

STATEMENT OF THE OPERATION

The flush mounted low impedance grounding cone or device, according to the invention, can be used in initial installations or to retrofit existing installations. It has certain unique advantages in the latter application. These advantages are made clear with the example set out below.

Referring again to FIGS. 1, 2 and 3 concurrently, in installations where kickpipe 18 is fastened to bulkhead 14 flush with the non-weather or compartment side thereof, coaxial cable 12 is stripped to bared shield 34 as shown in FIG. 1. For purposes of the invention, this stripped dimension should be about 0.875 inch. Next, a plurality of holes corresponding to the placement of the plurality of mounting holes 48, as shown in FIG. 3, are drilled and tapped into the non-weather or compartment side of bulkhead 14. Then the mirrored first and second halves 28 and 30 of low impedance grounding cone 26 are mounted flush with bulkhead 14 by the plurality of fasteners 32, as aforementioned. For purposes of the invention, fasteners 32 can be metallic screws.

Still referring to FIGS. 1, 2 and 3 concurrently, but in particular to FIG. 2, the spring pressure fingers or serrations 46, formed in the flared smaller end or serrated apexes 42 of low impedance cone 26, can eliminate the need for cable clamp 36 in some applications. Depending on the placement of the plurality of fasteners 32 in bulkhead 14, and the size of split slot 50 a sufficient pressure and, accordingly, electrical contact can be provided by serrations 46 alone. However, in those cases where the maximum protection from an EMP or similar electromagnetic interference source is required and necessary, it is preferred that serrated apexes 42 are secured to bared shield 34 by cable clamp 36 as shown in FIG. 1.

As shown in FIGS. 1 and 3, split slot 50 allows a controlled compression force to be applied to the bared shield 34 with or without the use of cable clamp 36. For coaxial cable of type RG-214, the width of the split slot 50 is about 0.025 inch. Split slot 50 is made by splitting or forming a hollow metallic cone lengthwise which, in turn, forms mirrored halves 28 and 30. Also, the diameter of a flanged base 40 is about 1.500 inches and the maximum inner diameter of a body portion 44 is about 0.750 inch. The height of a serrated apex 42 is about 0.312 inch, and its inner diameter is about 0.350 inch. The wall thickness of a low impedance grounding cone, according to the invention, is about 0.0625 inch. It should be realized by those skilled in the art that different dimensions can be used, and that the grounding device can be applied to other ranges of coaxial cable dimensions and types.

The grounding device is best used for retrofitting operational fleet ships which have been constructed with grounding systems having flush mounted kickpipes as illustrated in FIG. 1. In other cases, retrofitting is more difficult and will require cutting of the kickpipe flush with the non-weather or compartment side of the bulkhead. Also, in initial installation, the grounding device of the present invention is easy to use. For either of the above applications it will attenuate EMP or similar type interference, especially in the high frequency portion of the interference band (5 MHz to 10 MHz), to levels heretofore unattainable. The grounding device is functional out to 100 MHz.

The grounding device can be fabricated out of any metal which has good electrical conduction characteristics and which can be treated to withstand shipboard environmental conditions.

To those skilled in the art, many modifications and variations of the present invention are possible in light of the above teachings. It is therefore to be understood that the present invention may be practiced otherwise than as specifically described herein and still be within the spirit and scope of the appended claims.

What is claimed is:

1. A grounding device for forming a grounding connection between a ship's hull or bulkhead and a coaxial cable extending from the weather or external side of the bulkhead through an opening therein to the non-weather or compartment side thereof, the grounding device comprising:

a metallic cone having a slant height and being split or formed into two halves lengthwise, each half of the metallic cone including a flanged top portion, a flared bottom portion and a slant body portion integral and intermediate each of the flanged top and flared bottom portions;

means for flush mounting and securing the flanged top portion of each half of the cone to the non-weather side of the ship's hull about a bared shield of the coaxial cable and overlying the opening; and means for gripping the flared bottom portion of each half of the metallic cone to the bared shield, thereby forming a substantially continuous 360° electrical grounding connection between the ship's hull and the bared shield, the slant height from the top and bottom portions of each half of the cone being configured short enough, for a particular dimensioned coaxial cable, to present a low inductance and overall low impedance path for currents induced by an EMP or any electromagnetic interference source having a similar frequency range in an external length of the coaxial cable.

2. The grounding device of claim 1 wherein each of the flanged top portions includes a plurality of mounting holes spaced symmetically therein for screw mounting thereof to the ship's hull.

3. The grounding device of claim 2 wherein the means for gripping includes serrations formed in a length of each flared bottom portion on the inside surfaces thereof.

4. The grounding device of claim 3 wherein the means for gripping further includes a cable clamp fastenable around the length of each flared bottom portion on the outside surfaces thereof.

* * * * *